(12) United States Patent
Todorokihara

(10) Patent No.: US 8,461,821 B2
(45) Date of Patent: Jun. 11, 2013

(54) FREQUENCY MEASURING APPARATUS

(75) Inventor: Masayoshi Todorokihara, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 121 days.

(21) Appl. No.: 12/784,136

(22) Filed: May 20, 2010

(65) Prior Publication Data

US 2010/0295537 A1    Nov. 25, 2010

(30) Foreign Application Priority Data

May 22, 2009 (JP) ................................. 2009-123779

(51) Int. Cl.
*G01R 23/02* (2006.01)

(52) U.S. Cl.
USPC .................. 324/76.39; 324/76.41; 324/76.44; 324/76.48; 324/76.47; 327/47; 327/48; 327/49; 377/19; 377/47; 377/48; 377/49; 377/105; 377/121

(58) Field of Classification Search
USPC .................... 327/47–49; 377/19, 47–49, 105, 377/121; 324/76.39, 76.41, 76.44, 76.48, 324/76.47
See application file for complete search history.

(56) References Cited

U.S. PATENT DOCUMENTS

| | | | |
|---|---|---|---|
| 2,627,033 A | 1/1953 | Jensen et al. | |
| 2,840,812 A | 6/1958 | Di Giacomo | |
| 2,944,219 A | 7/1960 | Isokazu Tanaka et al. | |
| 3,026,473 A * | 3/1962 | De Mott | 324/615 |
| 3,056,085 A * | 9/1962 | James et al. | 375/242 |
| 3,144,623 A | 8/1964 | Steiner | |
| 3,227,952 A | 1/1966 | Proebster et al. | |
| 3,310,660 A | 3/1967 | Cogar | |
| 3,372,346 A | 3/1968 | Rogers et al. | |
| 3,407,290 A * | 10/1968 | Atrubin | 708/626 |
| 3,440,617 A | 4/1969 | Lesti | |
| 3,486,007 A | 12/1969 | Jacobson | |
| 3,551,826 A | 12/1970 | Sepe Raymond | |
| 3,553,579 A | 1/1971 | Teixeira | |
| 3,557,796 A | 1/1971 | Keller et al. | |

(Continued)

FOREIGN PATENT DOCUMENTS

| | | |
|---|---|---|
| JP | 53-111768 | 9/1978 |
| JP | A-56-169923 | 12/1981 |

(Continued)

OTHER PUBLICATIONS

Katano, K., "Introduction to Proper Method for Using Measuring Instruments; How to Use Timing Devices," Transistor Technology Seminar, 14th Installment, Feb. 1994, pp. 331-338 (with English translation).

(Continued)

*Primary Examiner* — Patrick Assouad
*Assistant Examiner* — Lamarr Brown
(74) *Attorney, Agent, or Firm* — Oliff & Berridge, PLC

(57) ABSTRACT

A frequency measuring apparatus includes: a high-order digit calculation section adapted to measure an input signal and output a high-order digit value of a frequency value of the input signal; a low-order digit calculation section adapted to measure the input signal and output a low-order digit value of the frequency value of the input signal; and an adding section adapted to add the high-order digit value and the low-order digit value to each other to output the frequency value of the input signal.

10 Claims, 13 Drawing Sheets

U.S. PATENT DOCUMENTS

| | | | |
|---|---|---|---|
| 3,605,017 A * | 9/1971 | Chertok et al. | 375/270 |
| 3,609,308 A | 9/1971 | Lemon et al. | |
| 3,624,494 A * | 11/1971 | Turan | 324/653 |
| 3,652,838 A * | 3/1972 | Dillon et al. | 700/295 |
| 3,686,565 A * | 8/1972 | Kelem et al. | 324/76.47 |
| 3,697,870 A | 10/1972 | Brenner | |
| 3,704,414 A * | 11/1972 | Herbst | 324/76.48 |
| 3,708,686 A | 1/1973 | Butler, Jr. et al. | |
| 3,733,471 A | 5/1973 | Gilberg | |
| 3,736,510 A | 5/1973 | Wu | |
| 3,742,353 A * | 6/1973 | Parisi | 324/76.53 |
| 3,743,940 A | 7/1973 | Yamagata | |
| 3,745,380 A | 7/1973 | Kitajima et al. | |
| 3,750,014 A * | 7/1973 | Gaw, Jr. | 324/76.48 |
| 3,755,734 A * | 8/1973 | Blanyer | 324/76.74 |
| 3,761,740 A * | 9/1973 | Naive | 327/46 |
| 3,766,818 A | 10/1973 | Prohofsky | |
| 3,775,681 A * | 11/1973 | Konrad | 324/76.68 |
| 3,777,121 A * | 12/1973 | Jamieson | 324/76.62 |
| 3,780,346 A | 12/1973 | Gagnon | |
| 3,795,771 A | 3/1974 | Gundersen et al. | |
| 3,803,487 A | 4/1974 | Iten | |
| 3,812,427 A * | 5/1974 | Coulter | 324/76.48 |
| 3,823,374 A * | 7/1974 | Dandliker et al. | 324/76.42 |
| 3,838,338 A | 9/1974 | Khoury | |
| 3,875,518 A | 4/1975 | Odams | |
| 3,930,199 A | 12/1975 | Valis | |
| 3,942,123 A | 3/1976 | Georgi | |
| 3,943,460 A | 3/1976 | Arai | |
| 4,041,387 A | 8/1977 | Dalichow et al. | |
| 4,051,434 A | 9/1977 | Sweet | |
| 4,063,169 A | 12/1977 | Palmer | |
| 4,130,799 A * | 12/1978 | Cherry | 324/76.47 |
| 4,137,497 A * | 1/1979 | Lowenschuss | 324/76.68 |
| 4,139,819 A | 2/1979 | Worley | |
| 4,139,870 A * | 2/1979 | Tachi | 360/43 |
| 4,144,490 A | 3/1979 | Stevens | |
| 4,150,432 A | 4/1979 | Sorden | |
| 4,169,213 A | 9/1979 | Dye et al. | |
| 4,310,891 A | 1/1982 | Niki | |
| 4,339,722 A | 7/1982 | Sydor et al. | |
| 4,345,206 A | 8/1982 | Skalka | |
| 4,368,354 A | 1/1983 | Furihata et al. | |
| 4,374,358 A * | 2/1983 | Hirose | 324/76.58 |
| 4,389,642 A * | 6/1983 | Kahn | 340/2.2 |
| 4,420,809 A | 12/1983 | Pierce | |
| 4,494,067 A * | 1/1985 | Barszczewski | 324/76.48 |
| 4,514,592 A * | 4/1985 | Miyaguchi | 380/30 |
| 4,544,892 A | 10/1985 | Kaufman et al. | |
| 4,546,490 A * | 10/1985 | Miller-Thomson et al. | 381/56 |
| 4,583,211 A | 4/1986 | Nishikawa et al. | |
| 4,588,979 A | 5/1986 | Adams | |
| 4,603,292 A * | 7/1986 | Russell | 324/76.39 |
| 4,609,990 A * | 9/1986 | Sember et al. | 702/78 |
| 4,616,173 A * | 10/1986 | Cook et al. | 324/76.62 |
| 4,651,089 A * | 3/1987 | Haigh | 324/76.42 |
| 4,667,689 A | 5/1987 | Kohashi | |
| 4,670,712 A * | 6/1987 | Lavergnat et al. | 324/76.39 |
| 4,672,556 A * | 6/1987 | Shepler | 702/78 |
| 4,695,791 A * | 9/1987 | Miller | 324/76.62 |
| 4,695,792 A | 9/1987 | Roy | |
| 4,707,653 A * | 11/1987 | Wagner | 324/76.63 |
| 4,716,363 A | 12/1987 | Dukes et al. | |
| 4,760,536 A | 7/1988 | Curtis | |
| 4,769,836 A | 9/1988 | Aihara | |
| 4,795,963 A | 1/1989 | Ueno et al. | |
| 4,864,588 A | 9/1989 | Simpson et al. | |
| 4,864,634 A | 9/1989 | Nakagawa et al. | |
| 4,880,005 A | 11/1989 | Pless et al. | |
| 4,984,254 A | 1/1991 | Thomas | |
| 5,027,228 A | 6/1991 | Yokoyama | |
| 5,065,095 A * | 11/1991 | Suzuki | 324/207.25 |
| 5,095,279 A | 3/1992 | Quan et al. | |
| 5,122,758 A | 6/1992 | Tomita | |
| 5,128,607 A | 7/1992 | Clark et al. | |
| 5,157,699 A | 10/1992 | Miyazaki et al. | |
| 5,206,549 A * | 4/1993 | Suzuki et al. | 327/40 |
| 5,262,714 A | 11/1993 | Friedman | |
| 5,302,916 A * | 4/1994 | Pritchett | 331/1 A |
| 5,304,938 A * | 4/1994 | Gregory et al. | 327/115 |
| 5,313,154 A * | 5/1994 | Norris | 324/76.48 |
| 5,317,215 A * | 5/1994 | Kranzler | 327/47 |
| 5,323,096 A | 6/1994 | Nakai | |
| 5,365,181 A * | 11/1994 | Mair | 327/116 |
| 5,381,085 A | 1/1995 | Fischer | |
| 5,442,278 A | 8/1995 | Fan Chiang et al. | |
| 5,448,606 A | 9/1995 | Snelgrove | |
| 5,509,040 A * | 4/1996 | Shimada | 377/117 |
| 5,539,355 A | 7/1996 | Nakamura | |
| 5,555,247 A | 9/1996 | Matsuoka et al. | |
| 5,650,954 A * | 7/1997 | Minuhin | 708/819 |
| 5,652,552 A | 7/1997 | Chung | |
| 5,710,710 A | 1/1998 | Owen et al. | |
| 5,764,045 A | 6/1998 | Hayashi | |
| 5,941,974 A | 8/1999 | Babin | |
| 6,018,560 A * | 1/2000 | Kim | 377/123 |
| 6,078,200 A | 6/2000 | Miyano | |
| 6,127,950 A | 10/2000 | Yamauchi | |
| 6,140,869 A | 10/2000 | Troise | |
| 6,172,579 B1 | 1/2001 | Dacus et al. | |
| 6,181,829 B1 | 1/2001 | Clark et al. | |
| 6,259,251 B1 | 7/2001 | Sugiura et al. | |
| 6,265,869 B1 | 7/2001 | Takahashi | |
| 6,282,803 B1 | 9/2001 | Dunne | |
| 6,359,938 B1 | 3/2002 | Keevill et al. | |
| 6,360,090 B1 * | 3/2002 | Holcombe et al. | 455/307 |
| 6,377,616 B1 * | 4/2002 | Brankovic et al. | 375/224 |
| 6,463,452 B1 * | 10/2002 | Schulist | 708/606 |
| 6,519,194 B2 | 2/2003 | Tsujino et al. | |
| 6,549,479 B2 | 4/2003 | Blodgett | |
| 6,590,400 B2 | 7/2003 | Hilliard et al. | |
| 6,665,367 B1 | 12/2003 | Blair | |
| 6,674,277 B1 | 1/2004 | Oishi et al. | |
| 6,675,326 B1 | 1/2004 | Yoshizaki | |
| 6,680,607 B2 | 1/2004 | Smith | |
| 6,759,838 B2 | 7/2004 | Tao et al. | |
| 6,888,902 B1 * | 5/2005 | Kondo | 375/344 |
| 6,917,191 B2 | 7/2005 | Oishi et al. | |
| 7,027,940 B2 * | 4/2006 | Iannuzzi | 702/66 |
| 7,046,964 B1 * | 5/2006 | Sullivan et al. | 455/67.11 |
| 7,068,744 B2 | 6/2006 | Watanabe | |
| 7,230,458 B2 | 6/2007 | DaDalt | |
| 7,242,223 B1 | 7/2007 | Alon | |
| 7,265,559 B1 | 9/2007 | Hladky et al. | |
| 7,266,756 B2 * | 9/2007 | Saado et al. | 714/790 |
| 7,271,631 B2 | 9/2007 | Watanabe | |
| 7,276,978 B2 | 10/2007 | Puma et al. | |
| 7,285,961 B2 | 10/2007 | Shinmoto et al. | |
| 7,372,875 B2 | 5/2008 | Hadzic et al. | |
| 7,394,723 B2 | 7/2008 | Rubin | |
| 7,429,896 B2 | 9/2008 | Hattori | |
| 7,436,265 B2 | 10/2008 | Park et al. | |
| 7,463,096 B2 | 12/2008 | Chi et al. | |
| 7,466,789 B2 | 12/2008 | Rieubon et al. | |
| 7,504,976 B1 | 3/2009 | Pellon | |
| 7,636,747 B2 | 12/2009 | Watanabe | |
| 7,692,419 B1 | 4/2010 | Peel | |
| 7,729,071 B2 * | 6/2010 | Harada | 360/39 |
| 7,737,688 B2 * | 6/2010 | Tomida et al. | 324/260 |
| 7,750,618 B1 | 7/2010 | Fang et al. | |
| 7,907,016 B2 | 3/2011 | Eikenbroek | |
| 8,139,685 B2 | 3/2012 | Simic et al. | |
| 8,242,941 B2 | 8/2012 | Arknaes-Pedersen et al. | |
| 2001/0045868 A1 | 11/2001 | Takeyabu et al. | |
| 2002/0024343 A1 * | 2/2002 | Moore | 324/619 |
| 2002/0097091 A1 | 7/2002 | Takagishi | |
| 2002/0167874 A1 | 11/2002 | Hayashi | |
| 2003/0038624 A1 | 2/2003 | Hilliard et al. | |
| 2003/0046064 A1 * | 3/2003 | Moriya et al. | 704/201 |
| 2003/0165112 A1 * | 9/2003 | Noda | 370/203 |
| 2003/0176932 A1 | 9/2003 | Wild | |
| 2003/0184346 A1 | 10/2003 | Lamb | |
| 2003/0215100 A1 | 11/2003 | Kimura et al. | |
| 2004/0075425 A1 | 4/2004 | Horio et al. | |
| 2004/0078737 A1 | 4/2004 | Miyamoto | |
| 2004/0196052 A1 | 10/2004 | Okayasu | |
| 2004/0199345 A1 * | 10/2004 | Ananthanarayanan et al. | 702/79 |

| | | | |
|---|---|---|---|
| 2005/0025270 A1 | 2/2005 | Muhammad et al. | |
| 2005/0110500 A1 | 5/2005 | Hoyte et al. | |
| 2005/0147197 A1* | 7/2005 | Perrott | 375/376 |
| 2005/0237125 A1 | 10/2005 | Hino | |
| 2005/0270043 A1* | 12/2005 | Iacob et al. | 324/714 |
| 2006/0084386 A1 | 4/2006 | Irie et al. | |
| 2006/0120537 A1 | 6/2006 | Burnett et al. | |
| 2006/0171496 A1 | 8/2006 | Nakamuta et al. | |
| 2006/0246865 A1* | 11/2006 | Makarov | 455/295 |
| 2006/0267698 A1 | 11/2006 | Erdogan et al. | |
| 2006/0285756 A1* | 12/2006 | Sugita | 382/232 |
| 2007/0094581 A1 | 4/2007 | Kajita | |
| 2007/0103333 A1 | 5/2007 | Michalski et al. | |
| 2007/0132442 A1 | 6/2007 | Jones | |
| 2007/0159938 A1 | 7/2007 | Sugawara et al. | |
| 2007/0216556 A1 | 9/2007 | Rieubon et al. | |
| 2008/0019471 A1 | 1/2008 | Waldner | |
| 2008/0068096 A1 | 3/2008 | Feng et al. | |
| 2008/0104072 A1 | 5/2008 | Stampleman et al. | |
| 2008/0136471 A1 | 6/2008 | Kamath | |
| 2008/0165862 A1 | 7/2008 | Takahashi | |
| 2008/0189064 A1 | 8/2008 | Yamaguchi et al. | |
| 2008/0191762 A1 | 8/2008 | Seethamraju et al. | |
| 2008/0204088 A1* | 8/2008 | Garlapati et al. | 327/115 |
| 2008/0229829 A1 | 9/2008 | Kondo | |
| 2008/0247500 A1* | 10/2008 | Goto et al. | 377/28 |
| 2008/0291287 A1 | 11/2008 | Dvir | |
| 2008/0320065 A1* | 12/2008 | Kan | 708/201 |
| 2009/0058452 A1 | 3/2009 | Tanaka et al. | |
| 2009/0058468 A1 | 3/2009 | Hjelm et al. | |
| 2009/0144018 A1 | 6/2009 | Chang et al. | |
| 2009/0153256 A1 | 6/2009 | Jo et al. | |
| 2009/0156150 A1 | 6/2009 | Deleon | |
| 2009/0180527 A1* | 7/2009 | Asami | 375/226 |
| 2009/0192958 A1* | 7/2009 | Todorokihara | 706/27 |
| 2009/0240994 A1 | 9/2009 | Lee | |
| 2009/0243736 A1 | 10/2009 | Miura et al. | |
| 2009/0251129 A1* | 10/2009 | Todorokihara et al. | 324/76.39 |
| 2009/0261809 A1* | 10/2009 | Li | 324/76.39 |
| 2009/0295460 A1 | 12/2009 | Gulba et al. | |
| 2009/0296878 A1 | 12/2009 | Tsai | |
| 2010/0054390 A1* | 3/2010 | Kim et al. | 377/47 |
| 2010/0091752 A1 | 4/2010 | Kemmochi et al. | |
| 2010/0213924 A1* | 8/2010 | Osumi et al. | 324/76.44 |
| 2010/0295535 A1* | 11/2010 | Todorokihara | 324/76.39 |
| 2010/0295536 A1* | 11/2010 | Todorokihara | 324/76.39 |
| 2010/0295537 A1 | 11/2010 | Todorokihara | |
| 2010/0315061 A1* | 12/2010 | Tomita et al. | 324/76.41 |
| 2011/0050352 A1 | 3/2011 | Kondo et al. | |
| 2011/0068828 A1 | 3/2011 | Anderson et al. | |
| 2011/0074514 A1* | 3/2011 | Marutani | 331/1 R |
| 2011/0082656 A1 | 4/2011 | Todorokihara | |
| 2011/0084687 A1 | 4/2011 | Todorokihara | |
| 2011/0182398 A1 | 7/2011 | Iwashita et al. | |
| 2011/0235772 A1* | 9/2011 | Obkircher | 377/48 |
| 2012/0019301 A1* | 1/2012 | Murray | 327/299 |
| 2012/0053903 A1 | 3/2012 | Todorokihara | |
| 2012/0161815 A1* | 6/2012 | Polivka | 327/48 |

FOREIGN PATENT DOCUMENTS

| | | |
|---|---|---|
| JP | A-61-501528 | 7/1986 |
| JP | A-61-223662 | 10/1986 |
| JP | A-62-298726 | 12/1987 |
| JP | A-64-054271 | 3/1989 |
| JP | A-02-252306 | 10/1990 |
| JP | A-04-048271 | 2/1992 |
| JP | A-04-072815 | 3/1992 |
| JP | A-04-357468 | 12/1992 |
| JP | A-05-030772 | 4/1993 |
| JP | A-5-172861 | 7/1993 |
| JP | A-06-011525 | 1/1994 |
| JP | A-06-501554 | 2/1994 |
| JP | A-06-164372 | 6/1994 |
| JP | A-06-235743 | 8/1994 |
| JP | A-06-342021 | 12/1994 |
| JP | A-7-55554 | 3/1995 |
| JP | A-7-229910 | 8/1995 |
| JP | A-09-178785 | 7/1997 |
| JP | A-10-132874 | 5/1998 |
| JP | A-10-170566 | 6/1998 |
| JP | A-11-220369 | 8/1999 |
| JP | A-11-264846 | 9/1999 |
| JP | A-2001-094395 | 4/2001 |
| JP | A-2001-119291 | 4/2001 |
| JP | A-2001-166008 | 6/2001 |
| JP | A-2001-177378 | 6/2001 |
| JP | A-2003-065768 | 3/2003 |
| JP | A-2003-194860 | 7/2003 |
| JP | A-2003-249905 | 9/2003 |
| JP | A-2003-307481 | 10/2003 |
| JP | A-2003-315356 | 11/2003 |
| JP | A-2005-020554 | 1/2005 |
| JP | A-2006-029874 | 2/2006 |
| JP | A-2007-060447 | 3/2007 |
| JP | A-2008-131500 | 6/2008 |
| JP | A-2009-229353 | 10/2009 |
| JP | A-2009-250807 | 10/2009 |
| JP | A-2009-250808 | 10/2009 |
| JP | A-2010-085286 | 4/2010 |
| JP | A-2010-127914 | 6/2010 |
| JP | A-2010-271210 | 12/2010 |
| JP | A-2010-271211 | 12/2010 |
| WO | WO 85-04487 A | 10/1985 |
| WO | WO 92/04634 A1 | 3/1992 |

OTHER PUBLICATIONS

Oct. 11, 2011 Office Action issued in U.S. Appl. No. 12/418,000.
Feb. 29, 2012 Office Action issued in U.S. Appl. No. 12/782,382.
Mar. 7, 2012 Office Action issued in U.S. Appl. No. 12/418,000.
Office Action issued Dec. 14, 2011 in U.S. Appl. No. 12/782,382.
Office Action issued Dec. 29, 2011 in U.S. Appl. No. 12/783,900.
Office Action issued Dec. 29, 2011 in U.S. Appl. No. 12/835,108.
Office Action dated May 23, 2012 issued in U.S. Appl. No. 12/784,136.
Office Action dated May 30, 3012 issued in U.S. Appl. No. 12/783,900.
Jun. 5, 2012 Office Action issued in U.S. Appl. No. 12/418,000.
May 25, 2012 Office Action dated issued in U.S. Appl. No. 12/782,382.
Jul. 23, 2012 Office Action issued in U.S. Appl. No. 12/835,108.
Jul. 31, 2012 Office Action issued in U.S. Appl. No. 12/418,000.
Sep. 19, 2012 Office Action dated issued in U.S. Appl. No. 12/782,382.
Sep. 27, 2012 Office Action Issued in U.S. Appl. No. 12/783,900.
Oct. 17, 2012 Office Action issued in U.S. Appl. No. 12/889,770.
U.S. Appl. No. 12/783,900 in the name of Todorokihara, filed May 20, 2010.
U.S. Appl. No. 12/835,108 in the name of Kondo, filed Jul. 13, 2010.
U.S. Appl. No. 12/889,770 in the name of Todorokihara, filed Sep. 24, 2010.
U.S. Appl. No. 12/782,382 in the name of Todorokihara, filed May 18 2010.
U.S. Appl. No. 12/418,000 in the name of Todorokihara, filed Apr. 3, 2009.
U.S. Appl. No. 12/896,106 in the name of Todorokihara, filed Oct. 1, 2010.
U.S. Appl. No. 13/211,726 in the name of Todorokihara, filed Aug. 17, 2011.
Nov. 13, 2012 Office Action issued in U.S. Appl. No. 12/896,106.
Nov. 28, 2012 Office Action issued in U.S. Appl. No. 12/418,000.
Nov. 30, 2012 Notice of Allowance issued in U.S. Appl. No. 12/782,382.
Jan. 14, 2013 Advisory Action issued in U.S. Appl. No. 12/783,900.
Jan. 28, 2013 Office Action issued in U.S. Appl. No. 12/783,900.
Jan. 31, 2013 Office Action issued in U.S. Appl. No. 12/889,770.
Apr. 8, 2013 Office Action issued in U.S. Appl. No. 12/835,108.
Notice of Allowance dated Mar. 13, 2013 issued in U.S. Appl. No. 12/782,382.

* cited by examiner

FREQUENCY MEASURING APPARATUS

The entire disclosure of Japanese Patent Application No. 2009-123779, filed May 22, 2009 is expressly incorporated by reference herein.

BACKGROUND

1. Technical Field

The present invention relates to a frequency measuring apparatus or the like, and in particular to improvement and so on of a frequency measuring apparatus for making it possible to measure an absolute frequency using a frequency measuring apparatus of a short gate time count method for counting an input signal in a predetermined time period, and removing a high-frequency component from a counted value train, thereby detecting a frequency variation component.

2. Related Art

As a method of measuring a frequency, there are known a direct count method (see, e.g., JP-A-2001-119291) of counting pulses passing therethrough in a predetermined gate time, a reciprocal method (see, e.g., JP-A-5-172861) of accurately measuring the pulse period and obtaining the frequency using the inverse of the period thus measured, and a method (see, e.g., U.S. Pat. No. 7,230,458) of obtaining a $\Delta\epsilon$ modulation signal to thereby find out the frequency.

The applicant has conducted research and development on a frequency measuring apparatus using a short gate time count method.

The frequency count method is arranged to repeatedly perform counting (sampling) with a short gate time without interruption to thereby remove a high-frequency component from the count value train thus obtained, and is capable of significantly improving both of the time resolution and the frequency resolution. The frequency counter of the present method is composed of a counter circuit and a small-scale arithmetic circuit, and has an advantage of easily achieving a multi-channel configuration while suppressing growth of the circuit scale. Further, it has an advantage that the resolution is improved as the sampling frequency is raised, for example.

However, the value obtained by demodulating the pulse train obtained by the short gate time count method is provided as a relative value of frequency. Although the counter circuit can be simplified, and it is sufficient for observing a relative variation, information of the absolute value (entire digits) of the measured frequency is missing.

Further, in the case of using only the least significant bit of the counter as the short gate time count value, it is not achievable to determine based only on the 1-bit information whether the train of 0 and 1 output from the counter positively corresponds to the magnitude of the count value or they have a complementary relationship.

SUMMARY

An advantage of some aspects of the invention is to provide a frequency measuring apparatus capable of measuring the whole frequency of an input signal with good accuracy.

Another advantage of some aspects of the invention is to provide a frequency measuring apparatus capable of being more easily and simply configured using a 1-bit counter (or an n-bit counter having only 1-bit output used) in the case in which an input signal is a binary signal.

Still another advantage of some aspects of the invention is to provide a frequency measuring apparatus capable of being configured to control the output based on the determination on whether or not the output of the 1-bit counter is inverted.

According to an aspect of the invention for achieving the advantages described above, there is provided a frequency measuring apparatus including a high-order digit calculation section adapted to measure an input signal and output a high-order digit value of a frequency value of the input signal, a low-order digit calculation section adapted to measure the input signal and output a low-order digit value of the frequency value of the input signal, and an adding section adapted to add the high-order digit value and the low-order digit value to each other to output the frequency value of the input signal, wherein the high-order digit calculation section includes a frequency counter section adapted to measure the frequency of the input signal for a unit time, and an offset calculation section adapted to remove a count value part corresponding to the low-order digit from a count value of the frequency counter to output the remainder as the high-order digit value, and the low-order digit calculation section includes a short gate time counter section adapted to count the frequency of the input signal for a time period shorter than the unit time period, a low pass filter section having a count value train of the short gate time counter as an input, and a scaling section adapted to reduce an output value of the low pass filter section into a value per unit time period, and output the reduced value as the low-order digit value.

According to the configuration described above, it is preferable that it becomes possible to measure the absolute frequency (whole frequency) of the input signal with good accuracy by supplementing the measuring range of the short gate time counter, which has good frequency measurement accuracy but has only a partial measurement range, with a frequency counter (e.g., a direct counter) capable of figuring out an approximate value of the whole frequency.

It is preferable that the short gate time counter section includes an n-bit output binary counter operating at the sampling frequency fs, and the offset calculation section outputs a numerical value obtained by multiplying a quotient obtained by dividing an approximate value of the frequency by the sampling frequency fs and $2^n$, the number of outputs of the n-bit output binary counter, by the sampling frequency fs and $2^n$, the number of outputs of the binary counter, as the high-order digit value. Thus, it becomes possible to supplement the frequency component of the input signal, which is not measured by the short gate time counter, by the output of the frequency counter.

It is also preferable that the input signal is a binary signal, the short gate time counter section includes a 1-bit output binary counter, and there are further provided a complement determination section adapted to determine whether or not a binary output train of the short gate time counter section corresponds positively to a magnitude of a count value, and a complement control section adapted to invert or non-invert the binary output train of the counter based on a determination result of the complement determination section. Thus, it becomes possible to avoid the reverse phenomenon (described later) of the output pattern of the 1-bit counter in the short gate time count method, an error in the 1-bit counter can be avoided, and a correct count output can be obtained.

In the case in which the input signal is a binary signal, it is preferable that the short gate time counter section includes a data latch operating at the sampling frequency fs, a 1-bit output binary counter, and a moving average filter with m taps, and the complement determination section performs the determination based on even/odd information of a least significant digit of an integer part of "(2×(approximate value of the frequency)/(sampling frequency fs)×(the number of taps of the moving average filter)." Thus, whether or not the inversion/non-inversion of the output pattern of the 1-bit counter output can be determined.

In the case in which the input signal is a binary signal, it is preferable that the short gate time counter section includes a data latch operating at the sampling frequency fs, a 1-bit output binary counter, and a moving average filter with m taps, and the offset calculation section outputs a numerical value obtained along an expression of (an integer part of (2×(an approximate value of the frequency)/(the sampling frequency fs)×(the number m of taps of the moving average filter))×(the sampling frequency)/(the number m of taps of the moving average filter)/2 as the high-order digit value. Thus, it becomes possible to supplement the frequency component of the input signal, which is not measured by the short gate time counter, by the output of the frequency counter.

It is preferable that the binary counter and the moving average filter with m taps are configured with m stages of registers and an exclusive OR circuit in an equivalent manner. It is preferable that the circuit configuration is thus simplified, and speeding up and lower power consumption of the circuit can be achieved due to the decrease in the number of transistors used.

It is also preferable that the sampling frequency fs and the number m of taps are controlled with respect to the input signal so that a carry or a borrow does not occur in the short gate time counter section. Thus, it is preferable that the circuit can be configured with 1-bit circuit, and the circuit can be simplified.

Further, according to another aspect of the invention, there is provided a frequency measuring apparatus including a short gate time counter section adapted to count a frequency of the input signal with a 1-bit output counter to generate a count output of the bit streaming, a low pass filter section adapted to remove a high-frequency component from the count output of the bit streaming, a complement determination section adapted to determine whether or not the count output of the short gate time counter section corresponds positively to magnitude of the count value based on an approximate value of a frequency of an input signal, and a complement control section disposed prior to the low pass filter section and adapted to invert or non-invert a binary output train of the short gate time counter section based on a determination result of the complement determination section.

By adopting such a configuration, it becomes possible to configure the primary part of the frequency measuring apparatus with a 1-bit circuit, thus the speeding up of the circuit and the simplification of the circuit become easy.

It is preferable that the short gate time counter section includes a data latch operating at the sampling frequency fs, a 1-bit output binary counter, and a moving average filter with m taps, and the complement determination section performs the determination based on even/odd information of a least significant digit of an integer part of "(2×(approximate value of the frequency)/(sampling frequency fs)×(the number of taps of the moving average filter)." Thus, it becomes possible to configure the frequency measuring apparatus with the circuit in which the binary counter and the moving average filter with m taps are simplified.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described.

The short gate time count method explained in the present application is a method of continuously counting the pulse train signal supplied thereto in a short gate time to obtain a series of count values acting as a pulse train corresponding to the frequency of the pulse train signal, then removing a high-frequency component from the series of count values to obtain a series of signals corresponding to the frequency of the pulse train signal supplied thereto, thereby extracting the frequency variation. Regarding such a short gate time count method, the circuit configuration and the operation thereof are explained in detail in JP-A-2009-250807. As described above, the short gate time count method is for obtaining the measured frequency value as a relative value.

The application intends to obtain an absolute value (entire digits) of the measured frequency in such a short gate time count type counter. Therefore, in the embodiment described below an approximate value of the measured frequency is obtained using a direct type counter or the like to supplement the range, which is not measured by the short gate time count method, thereby obtaining the absolute value of the measured frequency. In this case, the frequency range, which can be measured by the short gate time count type counter is obtained from a known sampling frequency.

Further, in another embodiment, the signal processing system is configured as an integrated circuit for processing a binary signal composed of the short gate time counter and the moving average filter in the frequency measuring apparatus arranged to be able to measure an absolute value of a frequency in the short gate time count type counter, thereby achieving simplification of the circuit configuration. In this case, the frequency range, which can be measured by the short gate time count type counter, is obtained using the sampling frequency and the number of taps of the moving average filter, and then the absolute value calculation (signal processing) of the measured frequency is performed. As an example of the binary signal, there can be cited, for example, a pulse train output of a pulse oscillator, a bit stream (serial digital data) signal shaped like a pulse train, and so on, but the binary signal is not limited thereto.

First Embodiment

Figure 1:
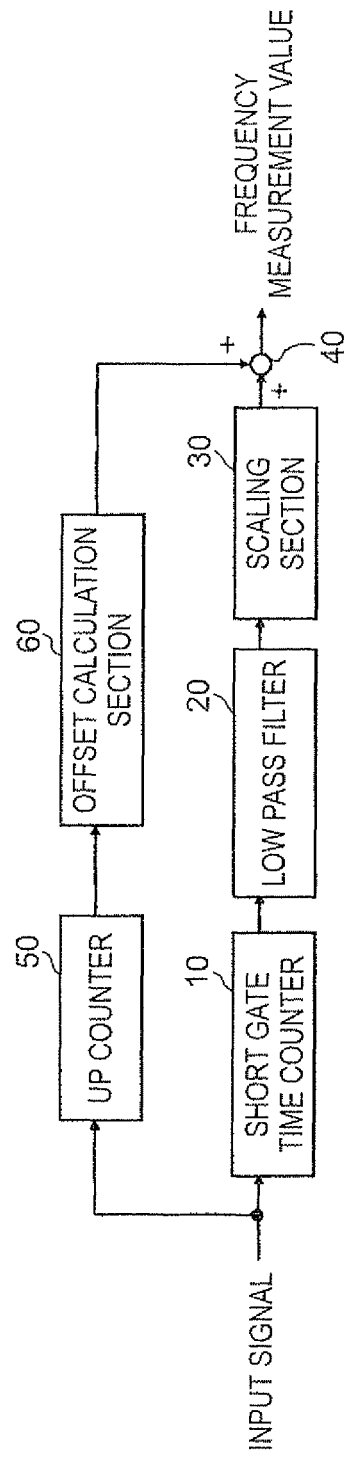
FIG. 1 is a block circuit diagram for explaining an embodiment of the invention.

Embodiments of the invention will hereinafter be described with reference to the accompanying drawings. FIG. 1 shows a first embodiment, wherein the frequency measuring apparatus is composed of, in rough classification, a high-order digit calculation section for obtaining a high-order portion of the frequency of an input signal, a low-order digit calculation section for obtaining lower digits of the frequency with good accuracy using the short gate time count method, and an adding section for combining the outputs of the respective calculation sections.

The low-order digit calculation section is mainly composed of a short gate time counter section 10, a low pass filter section 20, and a scaling section 30. The high-order digit calculation section is mainly composed of an up counter section 50 and an offset calculation section 60. The adding section is constituted with an adder 40.

Although not limited thereto, the input signal to be the object of the frequency measurement is, for example, a signal shaped like a pulse train output by the quartz oscillator of a QCM quartz sensor not shown (hereinafter also referred to as a "QCM device"). The QCM device is a mass sensor for measuring an extremely minute mass variation using a property that a matter attached to a surface of an electrode of a quartz vibrator causes a variation (drop) of the resonant frequency corresponding to the mass of the matter. The frequency variation range of the quartz oscillator of the QCM device due to attachment of a matter is known previously. The frequency measuring apparatus measures a frequency variation of a quartz oscillator using a vibrator of, for example, 30,001,893 Hz. The input signal from the quartz oscillator is supplied to the short gate time counter section 10 and the up counter section 50.

The short gate time counter section 10 is composed of, for example, a 2-bit binary counter continuously performing counting operation at a sampling frequency (fs) of 1 kHz. The count output of the short gate time counter section 10 is supplied to the low pass filter section 20.

The low pass filter section 20 is configured as a three-stage configuration of the moving average filters with the number of taps of 100 (the number of taps of each filter is 100). The low pass filter section 20 removes a high-frequency component from the continuous count value train to thereby take out the signal including the frequency variation component.

The scaling section 30 reduces the signal including frequency variation component, which is output from the low pass filter section 20, to a real frequency. In the present embodiment, in order for restoring to the frequency steps of 0 Hz, 1000 Hz, 2000 Hz, and 3000 Hz in accordance with the count value of "0," "1," "2," and "3" (in decimal expression) of the 2-bit binary counter in the short time counter section 10, the output of the low pass filter section 20 is multiplied by 1000 (multiplied by the sampling frequency).

Figure 2:
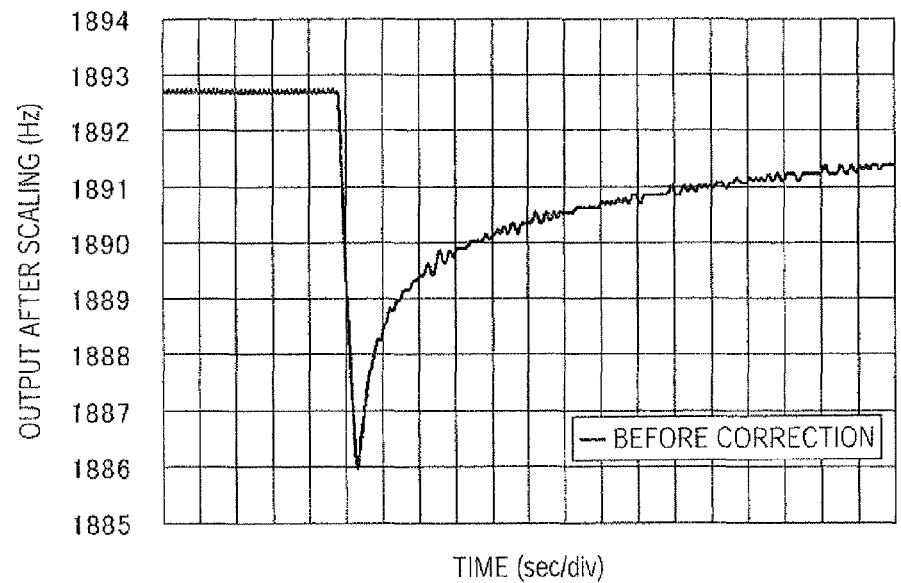
FIG. 2 is a graph showing an output of a frequency variation range portion (information of the absolute value is missing) obtained by a short gate time count method.

FIG. 2 shows an output example of the scaling section 30 in the case in which the input signal, which is obtained when an odor material is once attached to the quartz vibrator section of the QCM device, and then separated therefrom, is supplied to the measuring apparatus. As shown in the drawing, it is recognized that there is provided the frequency resolution equal to or higher than the resolution corresponding to 1 Hz. The output of the scaling section 30 is supplied to one input of the adder 40.

The input signal described above is supplied also to the up counter section 50. The up counter section 50 is composed by, for example, a direct type counter, and measures the number of pulses of the input signal during the gate time of 1 second. The up counter measures, for example, the input signal with a frequency of 30,001,893 Hz. It should be noted that since the gate time is 1 second, the up counter 50 is not capable of measuring the frequency equal to or lower than 1 Hz. This measurement result (an approximate value) is supplied to the offset calculation section 60.

The offset calculation section 60 eliminates the count range to be measured by the short gate time counter from the count value of the up counter 50. Therefore, the offset calculation section 60 obtains the quotient obtained by dividing the count value (the approximate value of the frequency) of the up counter section 50 by the sampling frequency fs and the output count $2^n$ (2 raised to the power of the number of bits of the counter) of the n-bit binary counter of the short gate time counter section 10. In the embodiment, there is used the 2-bit binary counter, and the output count is $2^2$ (2 raised to the power of the number of bits of the counter)=4. The value obtained by multiplying the quotient by the sampling frequency fs and "2 raised to the power of the number of bits of the counter" is output.

When describing the above using int[X] as a function of extracting the integer part of the numerical value X, in the offset calculation section 60, the following calculation is performed.

Int[(measured frequency)/(sampling frequency)/(2 raised to the power of the number of bits of the counter)]×(sampling frequency)×(2 raised to the power of the number of bits of the counter)

In the present embodiment, the following is obtained.

30,001,893 Hz (the approximate value of the count value)/1000 Hz (the sampling frequency $fs$)/$2^2$(2 raised to the power of the number of bits of the counter)=7,500 with a remainder of 1,893 (the quotient: 7500; the remainder: 1893)

Subsequently, the following calculation is performed,

7500(quotient)×1000 Hz ($fs$)×$2^2$(2 raised to the power of the number of bits of the counter)=30,000,000 Hz This output is supplied to the other input of the adder 40.

The adder 40 adds the output (low-order digits) of the scaling section 30 and the output 30,000,000 Hz (high-order digits) of the offset calculation section 60 to each other, and then outputs frequency measurement value of an absolute frequency.

Figure 3:
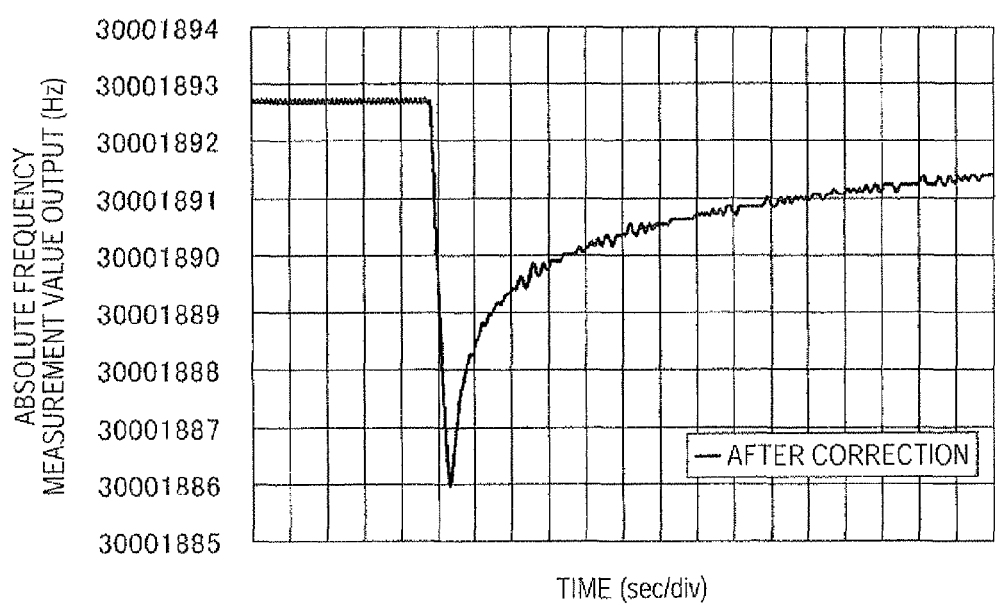
FIG. 3 is a graph showing an example of combining an approximate value of a frequency measured by an up-down counter 50 and a frequency measured by the short gate time count method with each other to obtain the absolute frequency (entire digits).

FIG. 3 shows an output example of the adder 40. The offset value (30,000,000 Hz) is added to the count value of the short gate time count method, thereby correcting a relative frequency measured by the counter of the short gate time count method into an absolute frequency.

It should be noted that it is recognized that if an approximate value of the oscillation frequency of the input signal is known, and the frequency variation range of the input signal is small compared to the entire frequency value as in the case of the QCM device, by adopting the design of detecting the frequency variation range of the input signal by the short gate time counter section, it is sufficient to supply the other input of the adder 40 simply with a fixed value (the offset value). In other words, it is understood that by adding the offset value thus calculated to the relative frequency (after scaling) measured by the short gate time count method, the absolute frequency can be obtained.

Second Embodiment

FIGS. 4 through 8 are diagrams for explaining an example of adopting a simple configuration as the configuration of the short gate time counter section 10 in the case in which the input signal is a binary signal. In each of the drawings, sections corresponding to those shown in FIG. 1 are denoted with the same reference numerals, and the description therefor will be omitted.

Figure 4:
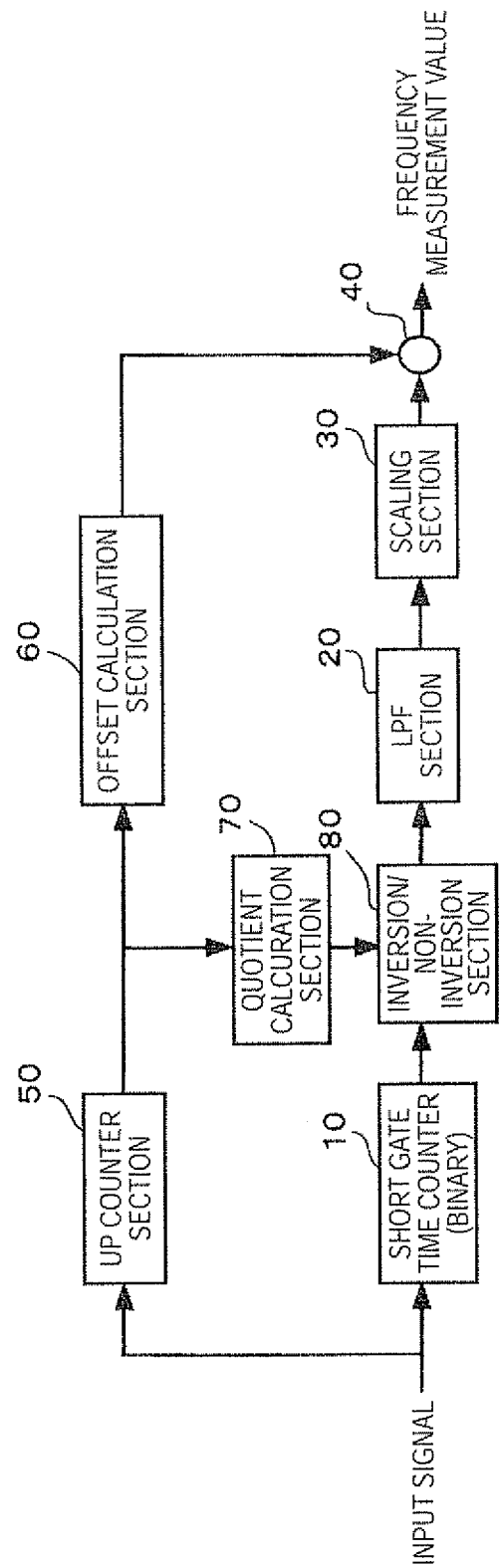
FIG. 4 is a block circuit diagram for explaining another embodiment of the invention.

FIG. 4 shows an example of configuring the short gate time counter section 10 of the frequency measuring apparatus shown in FIG. 1 with a 1-bit output (binary output) binary counter. In the case in which the sampling is performed by the 1-bit output binary counter to output the count value, as described later, there are two cases, one is the case in which the output value train positively corresponds to the magnitude of the count value, and the other is the case in which the output value train is reversed (complement) thereto.

Therefore, in the present embodiment, there are provided a quotient calculation circuit 70 described later for determining whether or not the output of the short gate time counter section 10 is a complement based on the approximate value of the up counter section 50, and an inversion/non-inversion section 80 for inverting or non-inverting the output of the up counter 50 based on the determination result of the quotient calculation circuit 70, and then relaying it to the low pass filter section 20. The up counter section 50 and the quotient calculation section 70 correspond to a complement determination section. The inversion/non-inversion section 80 corresponds to a complement control section.

In other words, in the second embodiment, the short gate time counter section 10, the low pass filter section 20, the up counter 50, the quotient calculation circuit 70, the inversion/non-inversion section 80, and so on constitute the 1-bit short gate time count type frequency measuring apparatus. The other constituents are substantially the same as those shown in FIG. 1.

FIGS. 5A through 5G, 6, and 7 are explanatory diagrams for explaining simplification of some circuits of the frequency measuring apparatus.

Figure 5A:
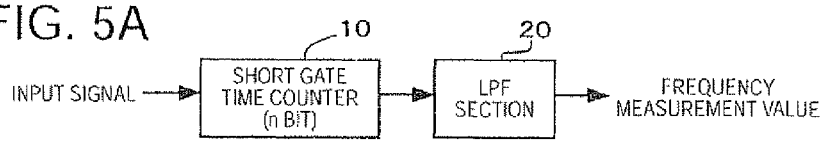
FIGS. 5A through 5G are block diagrams for explaining modified examples of the embodiment.

FIGS. 5A through 5G show the steps of the simplification of the circuit. As shown in FIG. 5A, the short gate time count type frequency measuring apparatus in the broad sense of the term is provided with the n-bit output counter section 10 for counting the input signal at a predetermined sampling frequency, and the low pass filter section 20 for removing the high-frequency component from the count value train to thereby extract the frequency variation component (a low-frequency component).

Figure 5B:
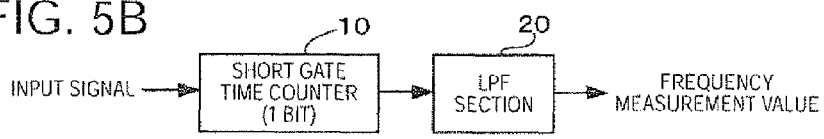

FIG. 5B shows the case in which the input signal is a binary signal, and the short gate time count type frequency measuring apparatus is arranged to have the 1-bit (binary) output counter section 10 performing the count at the sampling frequency selected so that the carry does not occur when counting the input signal, and the low pass filter section 20.

Figure 5C:
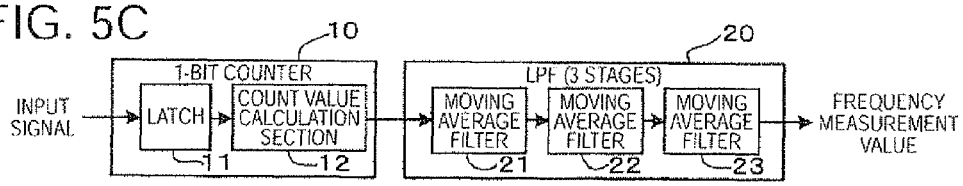
Figure 6:
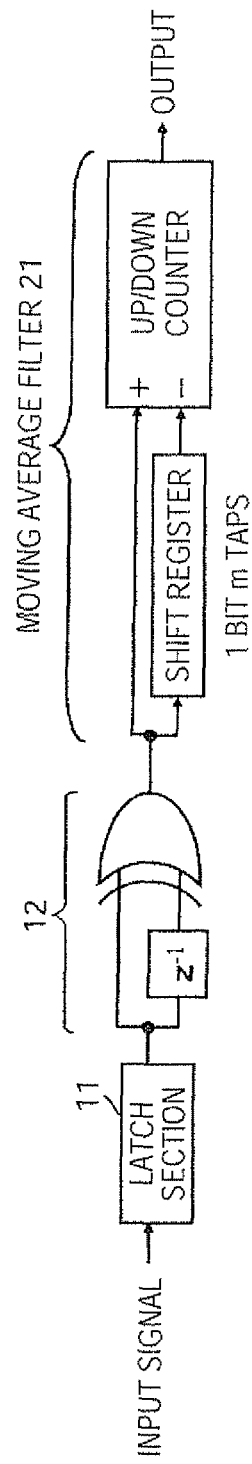
FIG. 6 is a block diagram for explaining an example of configuring a short gate time counter for processing the input signal with a 1-bit counter and a moving average filter.

As shown in FIG. 5C, the 1-bit counter is composed mainly of a latch 11 operating at the sampling frequency, and a count value calculation section 12 functioning as a counter of 1 bit. The output of the 1-bit counter takes "0" when the retention value is "0," and "0" is input, "1" when the retention value is "0," and "1" is input, "1" when the retention value is "1," and "0" is input, or "0" when the retention value is "1," and "1" is input. The 1-bit counter can be configured with one register and one exclusive OR circuit as shown in FIG. 6. The low pass filter section 20 can be composed of, for example, three stages of moving average filters 21. The moving average filter 21 can be composed of a 1-bit m-tap (m stages) shift register and an up counter.

Figure 5D:
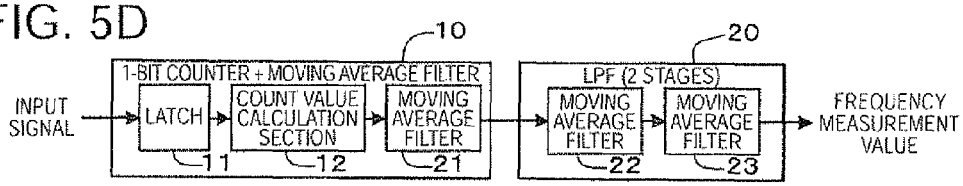

As shown in FIG. 5D, from a viewpoint of a circuit, the configuration of moving one stage of moving average filter to the side of the 1-bit counter section 10 is equivalent thereto.

Figure 5E:
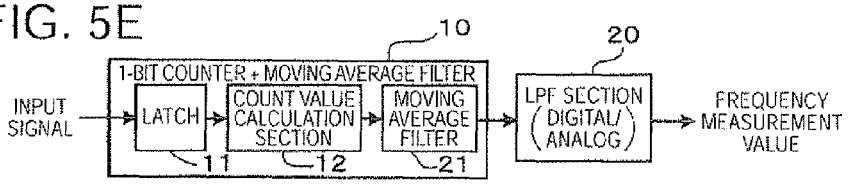

As shown in FIG. 5E, the remaining low pass filter section 20 is only required to function as a low pass filter. Either of a digital filter and an analog filter capable of providing a desired characteristic can be adopted.

Figure 5F:
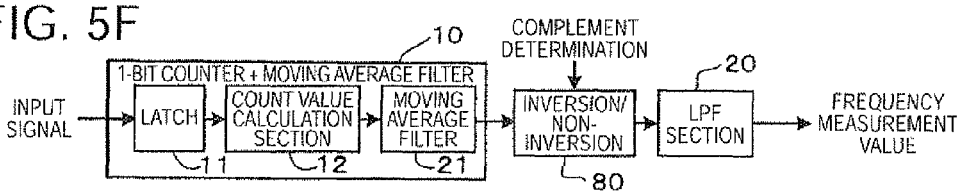

As shown in FIG. 5F, in the case of using the 1-bit counter, since the output thereof might become in the complement state in some cases, the inversion/non-inversion section 80 is provided to invert the count output if necessary as described above.

Figure 5G:
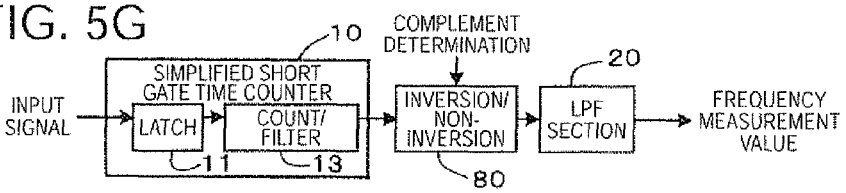

As shown in FIG. 5G, the functions of the count value calculation section 12 and the moving average filter are replaced with the equivalent function of a count/filter circuit 13.

It should be noted that in the configuration shown in FIG. 5F, it is also possible to adopt the configuration of disposing the inversion/non-inversion section 80 between the count value calculation section 12 and the moving average filter 21.

Figure 7A:
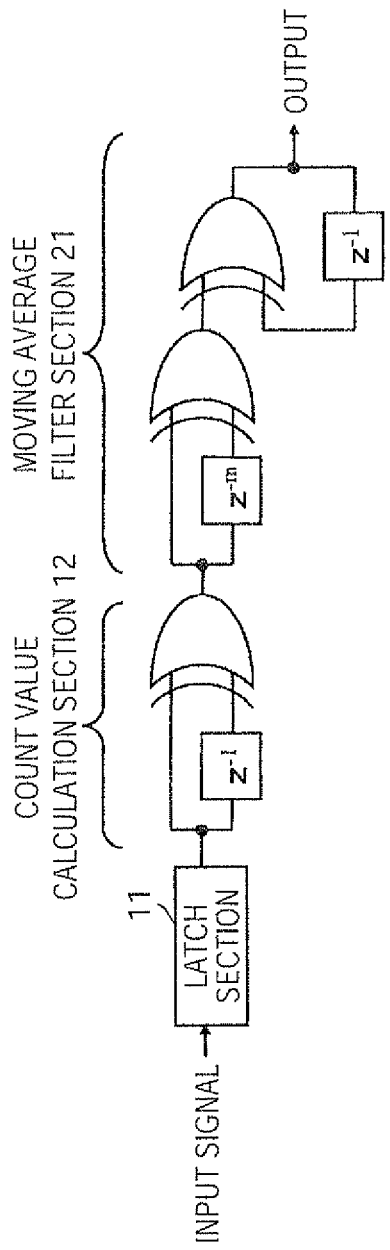
FIGS. 7A and 7B are block diagrams for explaining an example of simplifying the circuit shown in FIG. 6.

As shown in FIG. 7A, the count value calculation section 12 can be replaced with the 1-bit 1-tap register and the exclusive OR circuit. Further, the moving average filter 21 can be configured with the 1-bit m-tap shift register, the exclusive OR circuit, the 1-bit 1-tap register, and another exclusive OR circuit in an equivalent manner.

Figure 7B:
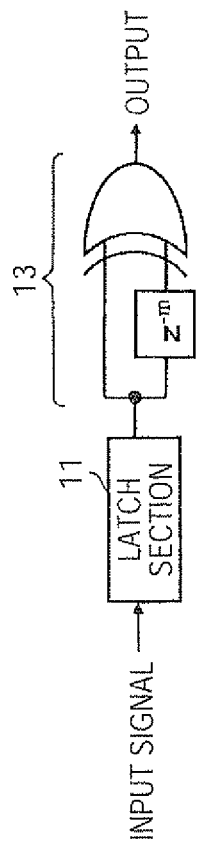

Further, as shown in FIG. 7B, the count value calculation section 12 and the moving average filter 21 are replaced with the count/filter circuit 13 composed of the 1-bit m-tap shift register and the exclusive OR circuit in an equivalent manner. The count/filter circuit 13 constitutes the short gate time counter together with the latch 11.

Figure 8:
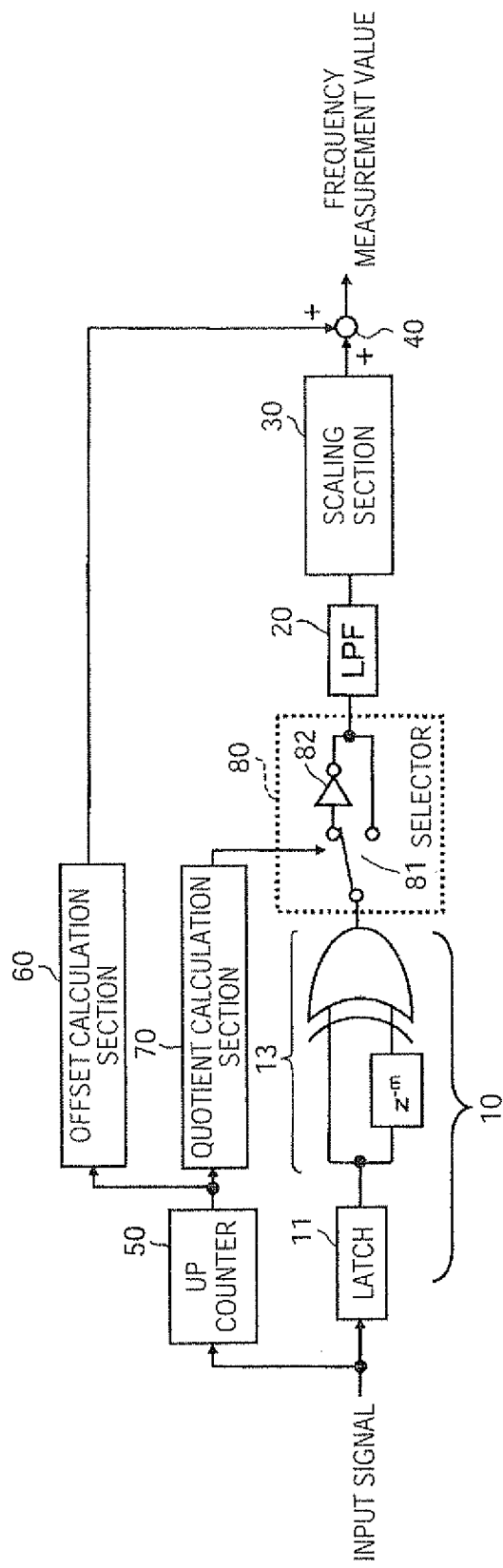
FIG. 8 is a block diagram for explaining an example of configuring an apparatus for measuring an absolute frequency using a 1-bit short gate time counter configured simply.

FIG. 8 shows an example of the frequency measuring apparatus using the short gate time counter section 10 reflecting the result of the simplification of the circuit described above. In the drawings, sections corresponding to those shown in FIG. 4 are denoted with the same reference numerals, and the description therefor will be omitted.

As shown in FIG. 8, in the short gate time counter section 10, the 1-bit counter 12 and the first stage 1-bit moving average filter 21 are replaced with the simplified circuit 13 if the processed signal is a binary signal. The present embodiment is for measuring the frequency variation of the QCM device using the quartz vibrator of, for example, 14,994,798 Hz.

For example, in the short gate time counter section 10, the sampling frequency fs of the latch 11 is 1 kHz, the number of taps of the moving average filter of the count/filter circuit 13 is 100, and a dual-stage moving average filter (the number of taps of each stage is 100) is used as the low pass filter section 30.

It should be noted that in the count/filter circuit 13, since the count is performed when the level of the input signal changes ("0"→"1," "1"→"0") from necessity of the configuration of the logic circuit, the input signal is counted in an apparently doubled manner.

The up counter 50 measures the count value with the gate time of about 1 second. In the embodiment, 14,994,798 Hz±1 count, for example, is measured.

The offset calculation section 60 doubles the count value of the up counter 50, and then obtains the quotient of the division process of dividing the doubled count value by "(sampling frequency)/(the number of taps of the moving average filter)." Then, the value obtained by multiplying the quotient by "(sampling frequency)/(the number of taps of the moving average filter)/2" is output as the offset value. As described above, when describing the above using Int[X] as a function of extracting the integer part of the numerical value X, in the offset calculation section 60, the following calculation is performed.

$$\text{Int}[2\times(\text{measured frequency})/(\text{sampling frequency})\times \\ (\text{the number of taps of the moving average filter})]\times(\text{sampling frequency})/(\text{the number of taps of the moving average filter})/2$$

In the embodiment, the following is output as the offset value.

$$(14{,}994{,}798\pm1)\times 2/(1000/100)=2{,}998{,}959\ldots 6\pm 2,\\ 2{,}988{,}959\times(1000/100)/2=14{,}994{,}795$$

The quotient calculation section 70 doubles the count value of the up counter 50, and then obtains the quotient of the division process of dividing the doubled count value by "(sampling frequency)/(the number of taps of the moving average filter)," and then outputs the least significant bit of the quotient. When describing the above using Int[X] as the function of extracting the integer part of the numerical value X, whether the train of "0" and "1" of the output of the count/filter circuit corresponds positively to the magnitude of the count value or they have the complement relationship is determined using the least significant bit information (even/odd information) of Int[2×(measured frequency)/(sampling frequency)×(the number of taps of the moving average filter)].

In the embodiment, the following is obtained, and the least significant bit "1" (odd number: inversion instruction) of the binary notation corresponding to 2,998,959 is output.

$$(14{,}994{,}798\pm 1)\times 2/(1000/100)=2{,}998{,}959\ldots 6\pm 2$$

This output is supplied to the inversion/non-inversion section 80. It should be noted that if the least significant bit of the binary notation is "0," "0" (even number: non-inversion instruction) is output to the inversion/non-inversion section 80.

As shown in FIG. 8, the inversion/non-inversion section 80 is composed of a selector 81 and an inverter (NOT) 82. When the output of the quotient calculation section 70 is "1," the selector 81 supplies the output of the counter 10 to the low pass filter section 20 via the inverter 82 so as to invert the output. Further, when the output of the quotient calculation section 70 is "0," the selector 81 supplies the output of the counter 10 directly to the low pass filter section 20. Thus, it is prevented that the output of the counter 10 is transmitted to the low pass filter section 20 in the inverted state.

The scaling section 30 calculates a reduced value of the frequency when the scaling is required for the output value of the low pass filter section 20. In the embodiment, the output values "0" and "1" are multiplied by 5 (multiplied by "(sampling frequency)/(the number of taps)/2") in order for adjusting the output value to the frequency step 10 Hz divided by 2 (i.e., 0 Hz, 5 Hz).

The adder 40 adds the offset value obtained by the offset calculation section 60 to the output of the scaling section 30. In the embodiment, 14,994,795 Hz is added as the offset value.

Figure 9:
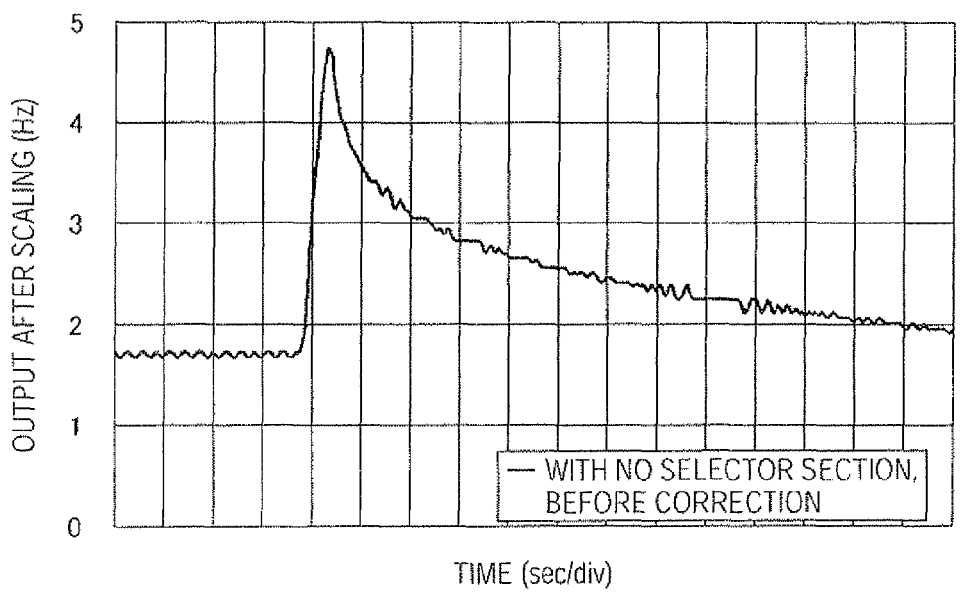
FIG. 9 is a graph for explaining an example in which an output of a combination of "a 1-bit counter and a moving average filter" is inverted (complement).

FIG. 9 shows the output of the scaling section 30 when the output inversion is not performed in the case in which the output of the counter section 10 is the complement output.

Figure 10:
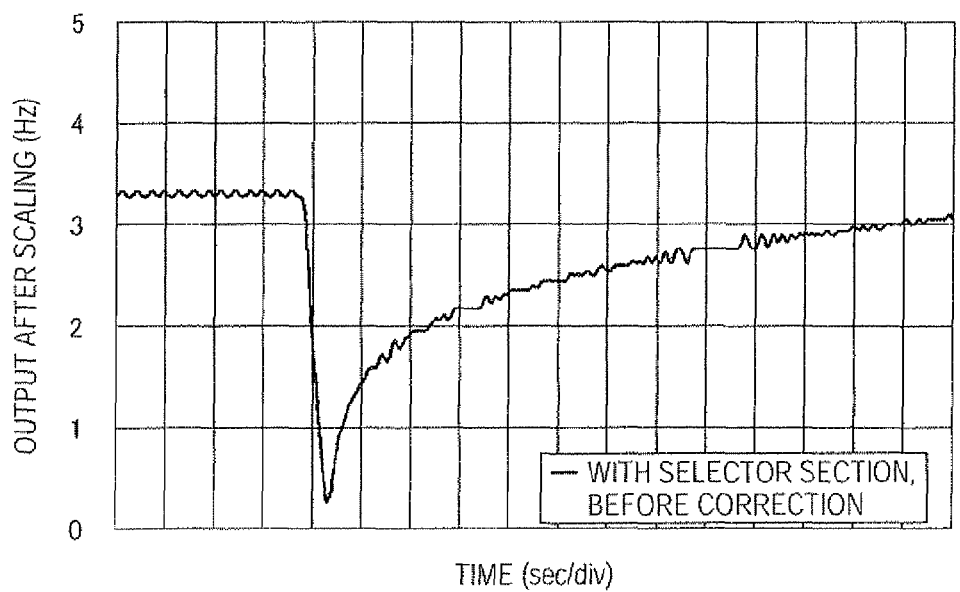
FIG. 10 is a graph for explaining an example in which the output of the combination of "a 1-bit counter and a moving average filter" corresponds positively to increase/decrease of the frequency.

FIG. 10 shows the output of the scaling section 30 when the complement output is inverted by the inversion/non-inversion section 80 in the case in which the output of the counter section 10 is the complement output.

Figure 11:
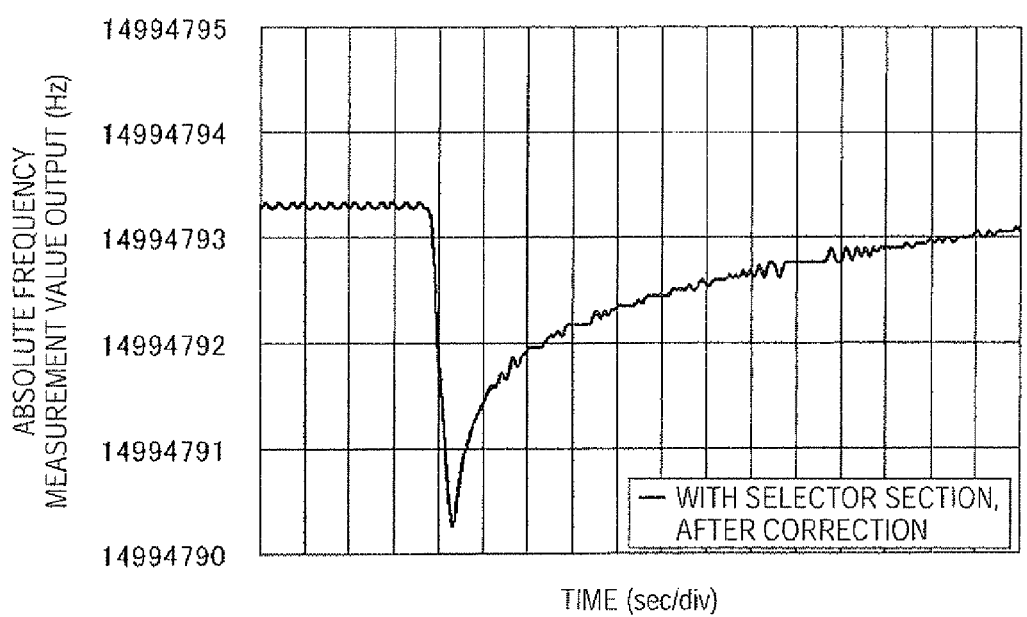
FIG. 11 is a graph for explaining an example of a measured value of an absolute frequency output from a measuring apparatus.

FIG. 11 shows an output example of the adder 40. The offset value (14,994,795 Hz) is added to the count value of the short gate time count method, thereby correcting a relative frequency measured by the counter of the short gate time count method into an absolute frequency.

Then, the inversion of the short gate time count output in the short gate time count method and the bit stream described above will be explained with reference to FIGS. 12 through 15.

Figure 12:
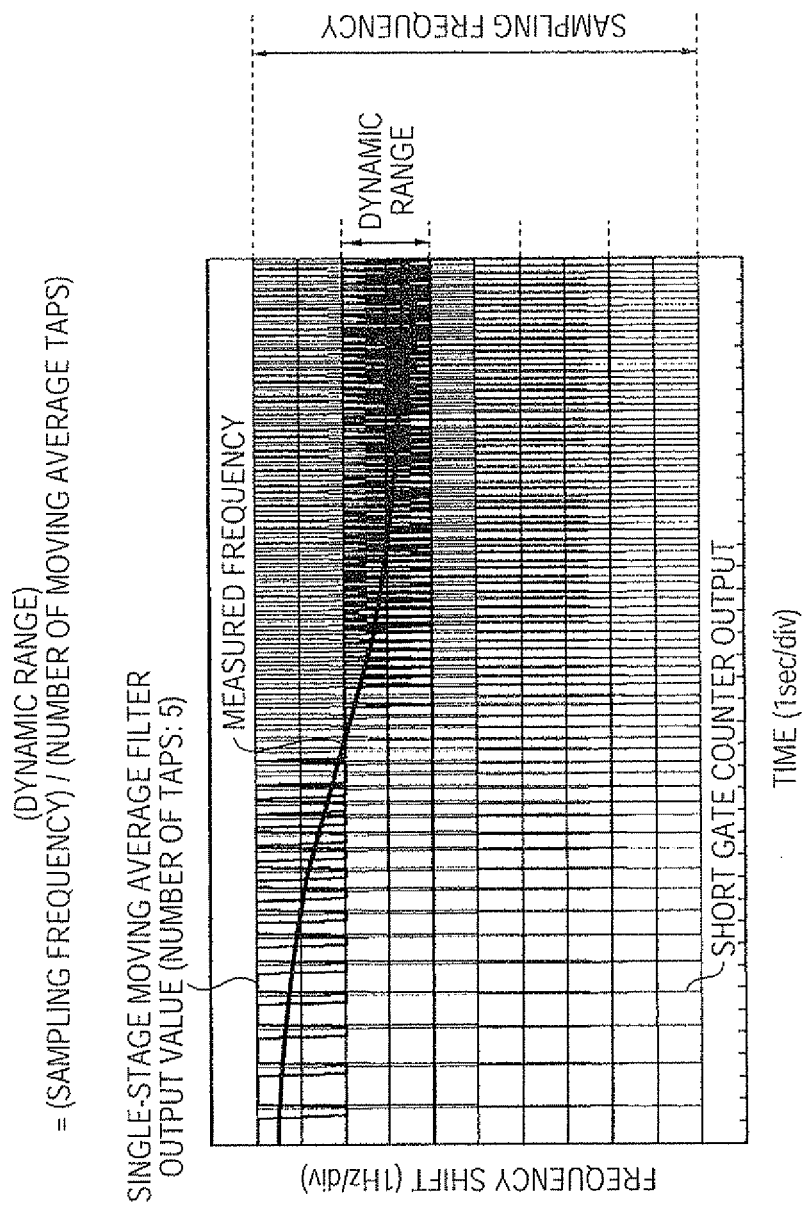
FIG. 12 is an explanatory diagram for explaining relationships between a dynamic range, a sampling frequency, the number of taps of a moving average filter.

FIG. 12 is a graph for explaining the relationship between the sampling frequency, the number of taps of the moving average filter, and the dynamic range in the case of treating the short gate time count output and a single-stage moving average filter output as a binary output (a bit stream).

The horizontal axis of the graph shown in the drawing represents time (second), and the vertical axis represents a frequency shift (Hz). In the graph, there are shown an output (a pulsed output illustrated with thin lines between the lower limit value and the upper limit value of the sampling frequency) of the short gate counter, an output (a pulsed output illustrated with thick lines) of the moving average filter (the number of taps is 5), and an output (a curve shown in the output pulse train of the moving average filter) of the low pass filter in the case in which the gate time is set to be 0.1 second (the sampling frequency of 10 Hz). The same is applied to FIGS. 13 through 15 below.

Here, the dynamic range is defined as "(dynamic range)= (sampling frequency)/(the number of taps of moving average filter)." In this example, the dynamic range is 2 (=10/5). If the short gate time count output falls within the dynamic range, no carry and no borrow occur in the counter, and the output of the counter becomes in the binary output state, thus the bit stream output is achieved. This can be achieved by selecting the sampling frequency and the number of taps of the moving average filter with respect to the frequency of the input signal. By making the signal of the part corresponding to the short gate time counter and the single-stage moving average filter as a bit stream, the circuit configuration corresponding to the part can be simplified by the logic gate or the like as described above.

Figure 13:
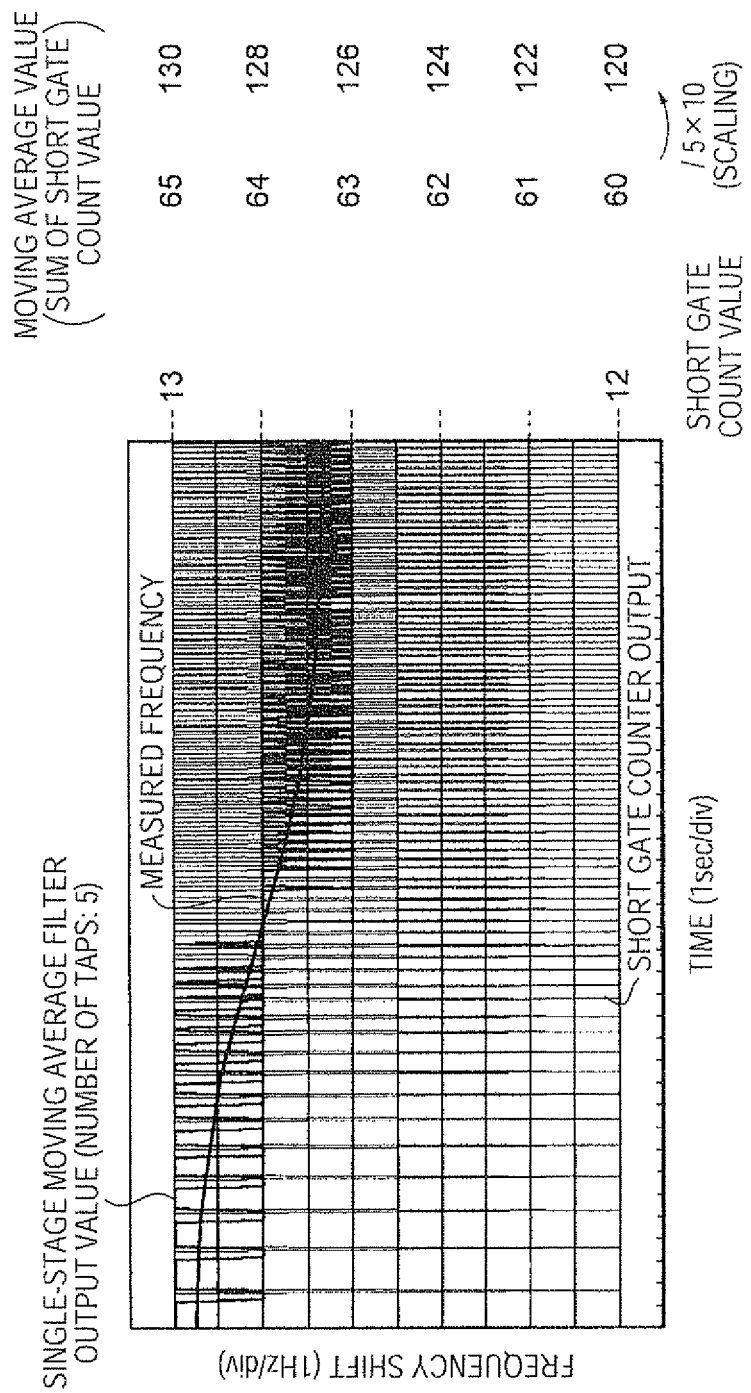
FIG. 13 is a graph for explaining an example of the case of treating a short gate time count value and a moving average value as integer numbers.

FIG. 13 shows an example (the case of treating the count value and the moving average value as integer values) of the short gate count value and the moving average filter output value.

For example, in the case of measuring the input signal varying between 120 Hz and 130 Hz with the gate time of 0.1 second (the sampling frequency of 10 Hz), the short gate count value becomes 12 or 13. Although the moving average is obtained by dividing the sum of the count values in the interval by the number of taps, in the case in which scaling is not considered, it is not required to divide it by the number of taps. If the number of taps is 5, either one of the values from 60 to 65 is output as the moving average value.

Figure 14:
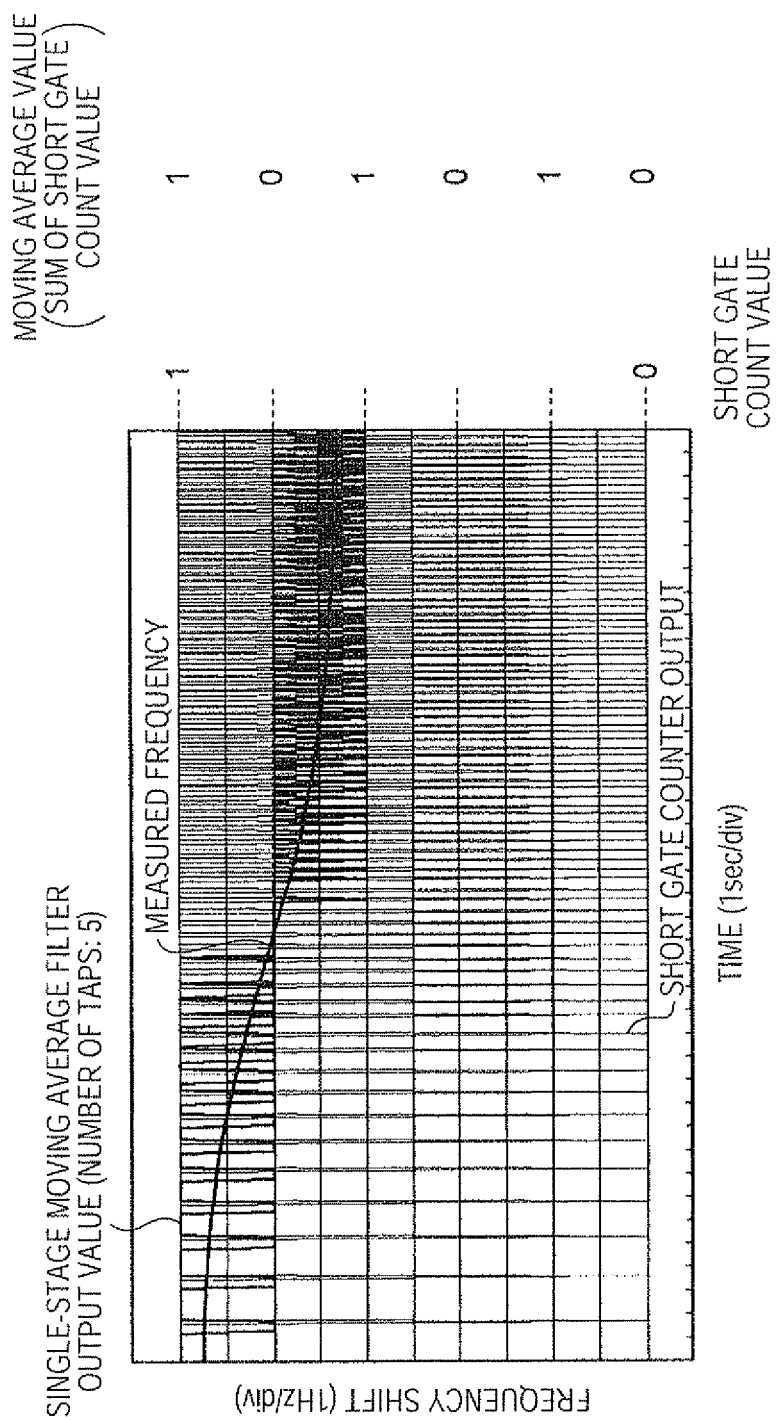
FIG. 14 is a graph for explaining an example of the case of treating the count value and the moving average value as binary numbers.

FIG. 14 shows an example (the case of treating the count value and the moving average value as a bit stream (serial digital data)) of the short gate count value and the moving average filter output value. In the case of treating the value as a bit stream, the value is replaced with a binary value. Specifically, the values shown on the right side of the graph of FIG. 13 are replaced in such a manner as "13"→"1," "12"→"0," "65"→"1," "64"→"0," ... "60"→"0."

Figure 15:
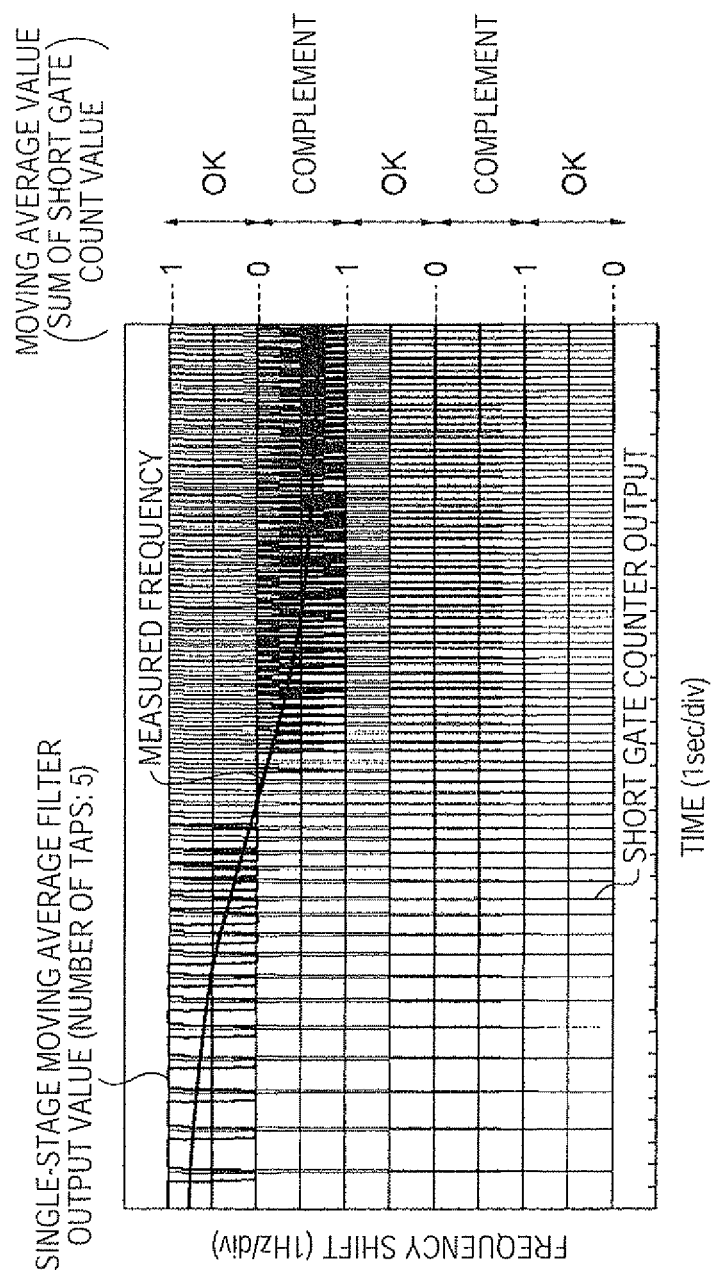
FIG. 15 is a graph for explaining an example (determination on complement/non-complement) of the case of treating the count value and the moving average value as binary numbers.

FIG. 15 shows an example (the case of treating the count value and the moving average value as a bit stream) of the moving average filter output value. On the right side of the graph of the drawing, there are described "OK," "COMPLEMENT," "OK," ... "OK" in the respective ranges of the output value of the moving average filter correspondingly to "1," "0," ... "0" in FIG. 14.

By comparing FIGS. 13 and 15 with each other, whether the magnitude correlation of the output value of the moving average filter corresponds positively to the increase/decrease correlation of the measured frequency or there is the complementary relationship therebetween is recognized (the right side column of FIG. 15) based on what range the measured frequency (the right side column of FIG. 13) falls in. Further, it is also recognized that these relations appear alternately. In the case in which the measured frequency is 0 Hz, taking the fact that the moving average filter output value also becomes 0 into consideration, it is understood that the increase/decrease correlation of the measured frequency and the magnitude correlation of the moving average filter output value correspond positively to each other if the quotient obtained by dividing the measured frequency by the range is an even number, and if the quotient is an odd number, they have the complementary relationship. Therefore, it is possible to make the output value of the moving average filter and the increase/decrease correlation of the measured frequency correspond correctly to each other by inverting the output value if the quotient is an odd number. The quotient calculation section 70 and the inversion/non-inversion section 80 assume the role described above.

As explained hereinabove, according to the embodiment of the invention, it becomes possible to obtain an absolute frequency using the short gate time count method by using the following value as the offset value, and applying the offset value to the frequency measurement result by the short gate time counting.

Int[(measured frequency)/(sampling frequency)/(2 raised to the power of the number of bits of the counter)]×(sampling frequency)×(2 raised to the power of the number of bits of the counter)

According to the embodiment of the invention, an absolute frequency can be measured with high resolution. The correction value such as an offset value thus obtained is valid unless the variation of the measured frequency exceeds the dynamic range during the measurement period (the re-correction becomes necessary if it exceeds the dynamic range to cause the carry or the borrow).

According to the embodiment of the invention, in the short gate time count type counter using the moving average filter, it is possible to determine whether the train of "0" and "1" of the counter output corresponds positively to the magnitude of the count value or they have the complementary relationship using the least significant bit information (even/odd information) of the Int[(measured frequency)/(sampling frequency)× (the number of taps of the moving average filter)]. By inverting the bit stream output when the train of "0" and "1" has the complementary relationship based on the determination result, head and tail of the frequency variation can correctly be output. It is preferable that the counting circuit can accurately be operated with the counter having 1-bit output.

According to the embodiment of the invention, the following is used as the offset, and the short gate time count type frequency measurement is performed, thereby obtaining an absolute frequency.

Int[(measured frequency)/(sampling frequency)×(the number of taps of the moving average filter)]× (sampling frequency)/(the number of taps of the moving average filter)

According to the embodiment of the invention, it is preferable that an absolute frequency can be measured with high resolution also in the short gate time count type counter.

A direct count type counter moderate in price can be used as a measure (the up counter 50) for obtaining the approximate value of the measured frequency. It is preferable that the relative frequency (the frequency variation range) can be obtained from the output of the low pass filter section 20, the absolute frequency can be obtained from the output of the adder 40, and thus, two types of frequencies can be obtained by one frequency measuring apparatus.

According to the embodiment of the invention, there is no need for recalculating the offset value unless the variation of the measured frequency exceeds the dynamic range. Providing the stationary frequency of the input signal and the frequency variation range thereof are known as in the case of the QCM device, the up counter section 50 for detecting the approximate value, the offset calculation section 60, the quotient calculation section 70, and so on can be replaced with calculation executed by a personal computer. Further, there can be obtained an advantage that the frequency measuring apparatus of the short gate time count method has a simple circuit configuration, and operates at high speed, thus the power consumption is small.

What is claimed is:

1. A frequency measuring apparatus comprising:
   a high-order digit calculation section adapted to obtain a high-order digit value of a frequency value of an input signal;
   a low-order digit calculation section adapted to obtain a low-order digit value of the frequency value of the input signal; and
   an adding section adapted to add the high-order digit value and the low-order digit value to output the frequency value of the input signal,
   wherein the high-order digit calculation section includes:
      a frequency counter section adapted to measure the frequency of the input signal during a unit time period, and
      an offset calculation section adapted to remove a count value part corresponding to the low-order digit from a count value of the frequency counter to output the remainder as the high-order digit value, and
   wherein the low-order digit calculation section includes:
      a short gate time counter section adapted to count the frequency of the input signal during a time period shorter than the unit time period,
      a low pass filter section adapted to remove high-a high frequency component from output of the short gate time counter section, and
      a scaling section adapted to convert an output value of the low pass filter section into a value per the unit time period, and output the value per the unit time period as the low-order digit value.

2. The frequency measuring apparatus according to claim 1, wherein
the short gate time counter section includes an n-bit output (n is an integer equal to or larger than 1) binary counter operable at a sampling frequency fs, and
the offset calculation section outputs a numerical value obtained by multiplying a quotient obtained by dividing a value of the frequency by the sampling frequency fs and $2^n$, the number of outputs of the n-bit output binary counter, by the sampling frequency fs and $2^n$, a result of multiplication of the quotient by the sampling frequency fs and $2^n$ as the high-order digit value.

3. The frequency measuring apparatus according to claim 1, wherein
the input signal is a binary signal, the short gate time counter section include a 1-bit output binary counter, and the frequency measuring apparatus further comprises:
a complement determination section adapted to determine whether or not a binary output of the short gate time counter section corresponds to a magnitude of a frequency of the input signal; and
a complement control section adapted to invert or non-invert the binary output based on a determination result of the complement determination section.

4. The frequency measuring apparatus according to claim 3, wherein
the short gate time counter section includes:
a data latch operating at the sampling frequency fs,
a 1-bit output binary counter, and
a moving average filter with m taps, and
the complement determination section obtains the determination result based on even/odd information of a least significant digit of an integer part of "(2'(an approximate value of the frequency)/(the sampling frequency fs)×(the number of taps of the moving average filter)."

5. The frequency measuring apparatus according to claim 3, wherein
the short gate time counter section includes
a data latch operating at the sampling frequency fs,
a 1-bit output binary counter, and
a moving average filter with m taps, and
the offset calculation section outputs a numerical value obtained along an expression of (an integer part of (2× (an approximate value of the frequency)/(the sampling frequency fs)×(the number m of taps of the moving average filter))×(the sampling frequency)/(the number m of taps of the moving average filter)/2 as the high-order digit value.

6. The frequency measuring apparatus according to claim 4, wherein
the binary counter and the moving average filter with m taps are configured with m stages of registers and an exclusive OR circuit.

7. The frequency measuring apparatus according to claim 4, wherein
the sampling frequency fs and the number m of taps are controlled so that a carry or a borrow does not occur in the short gate time counter section.

8. A frequency measuring apparatus comprising:
a short gate time counter section adapted to count a frequency of an input signal with a 1-bit counter to generate a count output;
a low pass filter section adapted to remove a high-frequency component from the count output;
a complement determination section adapted to determine whether or not the count output of the short gate time counter section corresponds to a magnitude of a frequency of the input signal based on an approximate value of the frequency of the input signal; and
a complement control section disposed prior to the low pass filter section and adapted to invert or non-invert the output that is a binary output of the short gate time counter section based on a determination result of the complement determination section.

9. The frequency measuring apparatus according to claim 8, wherein
the short gate time counter section includes:
a data latch operating at the sampling frequency fs,
a 1-bit output binary counter, and
a moving average filter with m taps, and
the complement determination section obtains the determination result based on even/odd information of an integer part of "(2×(an approximate value of the frequency)/(sampling frequency fs)×(the number of taps of the moving average filter)."

10. A frequency measuring apparatus that measures a frequency of a signal, the frequency measuring apparatus comprising:
a first section that measures and calculates a high-order digit value of a frequency value of the signal;
a second section that measures and calculates a low-order digit value of the frequency value of the signal; and
an adding section that adds the high-order digit value and the low-order digit value,
the first section including:
a frequency counter section that: i) counts the signal during a first gate time, and ii) outputs a first count value of the signal; and
an offset calculation section that calculates the high-order digit value, the high-order digit value corresponding to a difference digit value of the first count value and the low-order digit value,
the second section including:
a short gate time counter section that: i) counts the signal during a second gate time, the second gate time being shorter than the first gate time, and ii) outputs a second count value of the signal;
a low pass filter section, the second count value being input to the low pass filter section; and
a scaling section that outputs the low-order digit value, an output signal of the low pass filter being input to the scaling section.

* * * * *